United States Patent [19]

Lipschultz et al.

[11] Patent Number: 5,352,991

[45] Date of Patent: Oct. 4, 1994

[54] POWER AMPLIFIER ASSEMBLY

[75] Inventors: Jeffrey S. Lipschultz, Lake Zurich; John N. Lubbe, Chicago; Marc H. Pullman, Bartlett, all of Ill.

[73] Assignee: Motorola, Inc., Schaumburg, Ill.

[21] Appl. No.: 105,243

[22] Filed: Aug. 12, 1993

[51] Int. Cl.$^5$ .................. H01L 23/36; H01L 23/34
[52] U.S. Cl. .................... 330/289; 330/65; 330/66; 330/67; 330/68; 257/706; 257/707
[58] Field of Search ............ 330/65, 66, 67, 68, 330/289; 257/706, 707

[56] References Cited

U.S. PATENT DOCUMENTS

| | | | |
|---|---|---|---|
| 3,824,597 | 7/1974 | Berg | 370/41 |
| 4,688,002 | 8/1987 | Wingate | 330/264 |
| 4,703,339 | 10/1987 | Matsuo | 257/706 |
| 4,963,833 | 10/1990 | Mountz | 330/65 |
| 5,168,926 | 12/1992 | Watson et al. | 257/706 |
| 5,184,211 | 2/1993 | Fox | 257/706 |

*Primary Examiner*—William L. Sikes
*Assistant Examiner*—Fetsum Abraham
*Attorney, Agent, or Firm*—Timothy W. Markison

[57] ABSTRACT

A power amplifier assembly that dissipates a maximum of one thousand one hundred watts includes a power amplifier circuit and a chassis that has an overall volume of 0.02 cubic meters. The chassis includes a heat sink base that contains a mounting pattern for the power amplifier circuit. By thermally coupling the power amplifier circuit to the heat sink base via thermal coupling devices and the mounting pattern, the heat sink base dissipates a maximum of one thousand one hundred watts in a volume of 0.016 cubic meters.

12 Claims, 2 Drawing Sheets

POWER AMPLIFIER ASSEMBLY

FIELD OF THE INVENTION

This invention relates generally to power amplifier assemblies and, in particular, to a power amplifier assembly that dissipates a maximum of one thousand one hundred watts.

BACKGROUND OF THE INVENTION

Radio frequency (RF) power amplifier assemblies are known to include a power amplifier circuit, a cover, and a chassis that contains a heat sink. The power amplifier circuit typically includes multiple known amplifier circuits, DC distribution circuitry, and peripheral circuitry, such as a lowpass filter, a directional coupler, and an isolator. The circuit elements of the power amplifier are attached to the heat sink via screws or other equivalent fasteners, to accommodate the extraction of heat from the circuit elements to the heat sink during operation. The cover is attached to the chassis and encloses the power amplifier circuit to provide environmental and electromagnetic shielding of the enclosed circuitry. When a low level input signal is provided to the input of the power amplifier assembly, the power amplifier circuit amplifies the input signal to a predetermined output level and provides the amplified signal to the power amplifier assembly's output.

Since the power amplifier assembly is inherently inefficient, a significant amount of heat is generated by the power amplifier circuit during amplification of the input signal. Efficiencies of high power RF power amplifier assemblies (i.e. assemblies which provide over twenty-five watts of output power) are generally limited to a range of twenty to fifty percent due to the limitations of present technology. Thus, in power amplifier assemblies that provide several hundred watts of RF output power, as is often the case with power amplifier assemblies incorporated in paging transmitters, heat sink power dissipations of over one kilowatt are commonplace.

Prior art techniques have provided a variety of solutions to the dissipation dilemma. One approach utilizes a cast heat sink that occupies a volume of over 0.08 cubic meters and weighs approximately eighty pounds to dissipate one thousand five hundred watts while providing approximately three hundred watts of RF output power. Another approach, as detailed in U.S. Pat. No. 4,963,833, substantially reduces the weight of the power amplifier assembly by using heat pipe technology. However, none of the prior art solutions, with one kilowatt heat sink dissipation capabilities, provide compatibility with the current market's desire for modularity in base station, or repeater, designs due to their large sizes and unique mechanics.

Therefore, a need exists for a power amplifier assembly that occupies substantially less volume than prior art assemblies that dissipates at least one kilowatt, that is compatible with modular designs, and that utilizes preferred heat sink technology.

DESCRIPTION OF A PREFERRED EMBODIMENT

Generally, the present invention provides a power amplifier assembly that dissipates a maximum of one thousand one hundred watts. This is accomplished by thermally coupling a power amplifier circuit to a heat sink base of a chassis that has an overall volume of 0.02 cubic meters. The heat sink base contains a mounting pattern for the power amplifier circuit such that, when the power amplifier circuit is thermally coupled to the heat sink base via the mounting pattern, the heat sink base dissipates one thousand one hundred watts in a volume of 0.016 cubic meters. Thus, the present invention provides substantially more power dissipation per volume than was previously attainable with prior art power amplifier assemblies.

Figure 1:
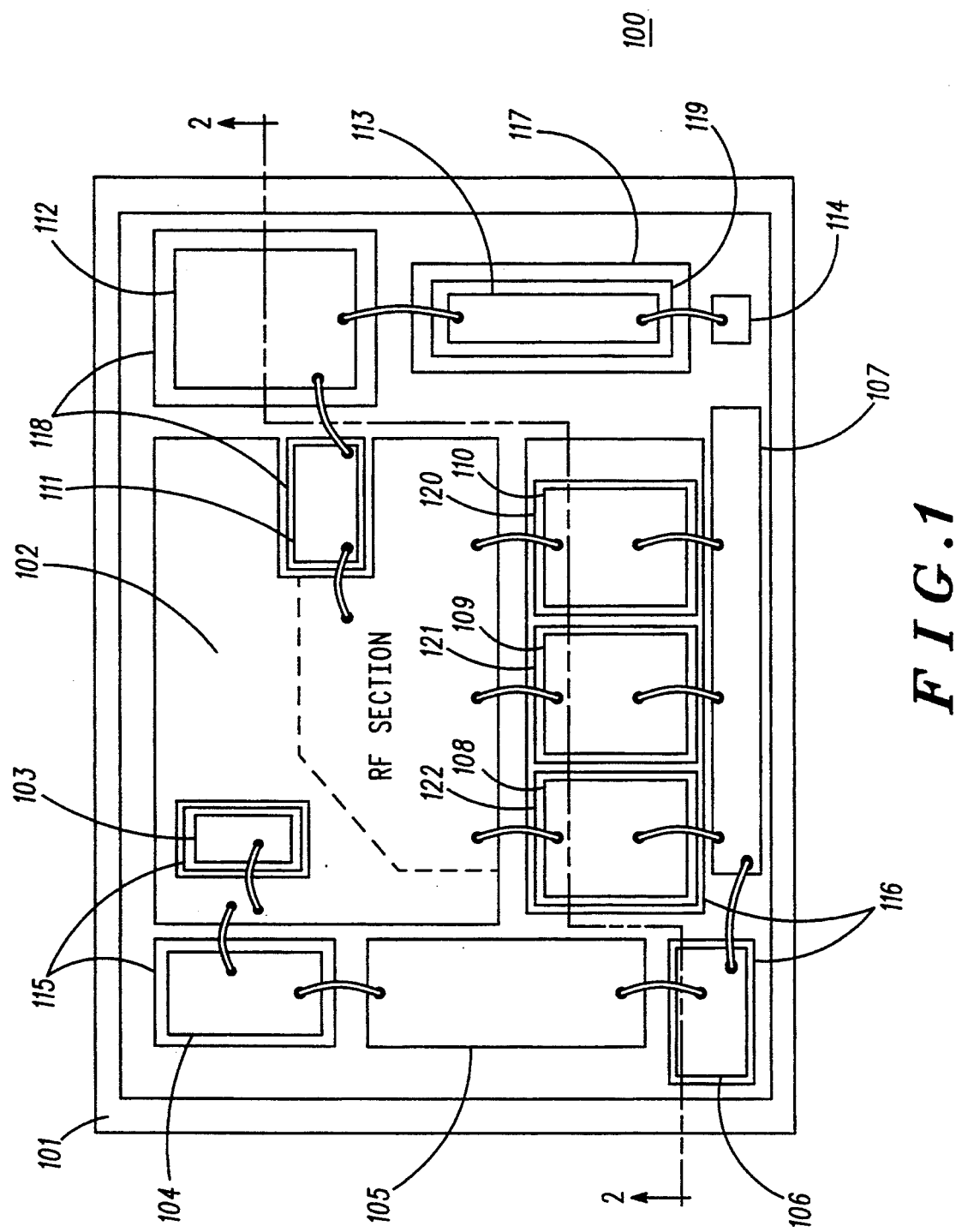
FIG. 1 illustrates a top view of a power amplifier assembly in accordance with the present invention.

The present invention can be more fully described with reference to FIGS. 1–3. FIG. 1 illustrates a top view of a power amplifier assembly 100 that includes a heat sink base 101, a power amplifier circuit, and a plurality of thermal coupling devices 119–122. The power amplifier circuit includes a plurality of circuit elements 102, 103, 105–107, 111–114 and four power elements 104, 108–110 that are thermally coupled to their respective thermal coupling devices 119–122. The heat sink base 101 includes a multiplicity of recessed areas 115–118 that form a mounting pattern for the circuit elements and the thermal coupling devices 119–122.

The circuit elements include a DC distribution module 102, a pre-amplifier module 103, an interconnect board 105, a splitter module 106, a radio frequency (RF) interconnect board 107, a combiner module 111, an isolator module 112, a lowpass filter and directional coupler module 113, and an RF output 114. The DC distribution module 102 is a single or multiple layer printed circuit board or combination of printed circuit boards that supplies DC power from a power source (not shown), via a card edge or similar connector, to the four power elements 104, 108–110. The preamplifier module 103 contains at least one RF amplifier circuit and may be mounted to the heat sink base 101 in a recessed area 115.

The interconnect board 105, RF interconnect board 107, splitter module 106, and combiner module 111 are printed circuit, or ceramic, boards that support RF transmission media, such as transmission lines or coaxial cables. The interconnect board 105 provides an RF transfer medium between the first power element 104 and the splitter module 106. The RF interconnect board 107 distributes the RF signals provided by the splitter module 106 to the second, third, and fourth power elements 108–110. Both interconnect boards 105 and 107 are normally mounted to the heat sink base 101 with screws, but may alternatively be attached via snaps or epoxy. The splitter module 106 utilizes power splitting techniques to divide the RF signal produced by the first power element 104 into multiple equal power signals which are used to drive the second, third, and fourth power elements 108–110. The combiner module 111 uses power combining techniques to combine the amplified RF signals produced by the second, third, and fourth power elements 108–110 and supplies the combined signal to the isolator 112. Generally, the splitter and combiner modules 106 and 111 are thermally coupled, via solder or conductive epoxy, to respective thermal coupling devices (not shown) and are mounted to the heat sink base 101 via respective recessed areas 116 and 118. The thermal coupling devices preferably comprise graphite, but may also be metallic or another carbon composition material.

The isolator module 112, the lowpass filter and directional coupler module 113, and the RF output 114 provide the circuit elements through which the combined RF signal passes prior to leaving the power amplifier assembly 100. The isolator module 112 comprises a circulator and a high power resistive termination which isolate the second, third, and fourth power elements 108–110 from highly reactive loads, such as a lowpass filter, at the isolator module's output. The isolator module 112 may be attached to a metal carrier (not shown) prior to being fastened to a recessed area 118 of the heat sink base 101 or may be directly attached to the heat sink base 101. The lowpass filter and directional coupler module 113 is a printed circuit, or ceramic, board that contains a lowpass filter and directional coupler. The lowpass filter is a discrete or distributed filter that attenuates harmonic energy produced by inherent nonlinearities in the four power elements 104, 108–110. The directional coupler samples the forward and reflected signals present at the RF output 114 and provides DC voltages proportional to the samples. The DC voltages are used for power control and diagnostics of the power amplifier assembly 100. The RF output 114 is an RF connector which protrudes through the heat sink base 101 and provides a transmission path from the power amplifier circuit to a load of the power amplifier assembly 100. Similar to the splitter and combiner modules 106 and 111, the lowpass filter and directional coupler module 113 is thermally coupled, via solder or conductive epoxy, to its respective thermal coupling device 119 and mounted to the heat sink base 101 via its recessed area 117.

The four power elements 104, 108–110 generally comprise at least one RF amplifier circuit deposited on a ceramic substrate, but may also include any RF amplifier circuit fabricated on various printed circuit boards or combinations thereof. Each RF amplifier circuit includes an RF amplifying element, such as a bipolar junction transistor or field-effect transistor, input and output matching circuitry, and any biasing and recoupling circuitry necessary to allow functionality of the RF amplifying element. In a preferred embodiment, the first power element 104 includes one RF amplifier circuit and each of the second, third, and fourth power elements 108–110 include two RF amplifier circuits. As briefly mentioned above, the four power elements 104, 108–110 are thermally coupled, via solder or conductive epoxy, to their respective thermal coupling devices 120–122. Note, the thermal coupling device for the first power element 104 is not shown.

General operation of a preferred embodiment of the power amplifier circuit occurs in the following manner. An RF input connector (not shown), located in the rear of the power amplifier assembly 100, receives a low level RF signal (approximately 100 milliwatts). The input RF signal is provided to the pre-amplifier module 103 where it is amplified to approximately 10 watts. The output of the pre-amplifier module 103 is supplied to the first power element 104 where it is subsequently amplified to about 90 watts. The 90 watt RF signal is transferred to the splitter module 106 via the interconnect board 105. The splitter module 106 splits the 90 watt signal into three 30 watt signals which are delivered to the RF interconnect board 107. The three 30 watt signals are routed through three equal phase transmission lines on the RF interconnect board 107 and provided to the inputs of the second, third, and fourth power elements 108–110. The second, third, and fourth power elements 108–110 amplify their respective 30 watt input signals to approximately 150 watts each and deliver the three signals to the RF section of the DC distribution module 102. The three 150 watt signals traverse three equal phase transmission lines on the DC distribution module 102 and are supplied to the combiner module 111. The combiner module 111 combines the three 150 watt signals to produce a combined output of about 425 watts, including combining losses. As briefly mentioned above, DC power utilized by all four power elements 104, 108–110 during operation of the power amplifier assembly 100 is supplied from a power source via the DC distribution module 102.

The combined output propagates sequentially through the isolator module 112, the lowpass filter and directional coupler module 113, and the RF output 114 prior to availability at the power amplifier assembly's output port. The isolator module 112 provides additional loss to the combined output while protecting the second, third, and fourth power elements 108–110 from damage due to high reflected powers. The low pass filter and directional coupler module 113 attenuates harmonic energy in the combined output and provides DC voltages proportional to the forward and reflected powers at the RF output 114. The power of the combined signal at the output of the power amplifier assembly 100 is typically 300 watts due to the losses in the isolator module 112 and lowpass filter and directional coupler module 113.

To produce the aforementioned RF power at the RF output 114 of the power amplifier circuit, the power amplifier circuit generates a considerable amount of heat which is dissipated by the power amplifier assembly 100. Due to limits of technology at the time of the present invention, the efficiency of the power amplifier circuit is approximately twenty-eight percent. Thus, the dissipation of the power amplifier assembly 100 approaches 1,100 watts when the power amplifier circuit provides 300 watts of RF output power. The heat from the power amplifier circuit is dissipated into the heat sink base 101, which is preferably 0.431 meters wide by 0.305 meters long. Metallic fins are attached to the heat sink base 101 using known attachment techniques. One such technique bonds the fins to the heat sink base 101 with an epoxy bonding material and is described in co-pending U.S. patent application No. 07/973,855, entitled "Method And Apparatus Of An Improved Heat Sink" and assigned to Motorola Inc. In the preferred embodiment, the metallic fins are approximately 1 millimeter thick and are equally spaced at about 6 millimeter intervals across the underside of the heat sink base 101.

The above implementation of the heat sink base 101 enables the 1,100 watts to be dissipated in a volume of 0.016 cubic meters at room temperature. This volume is a distinct improvement over prior art volumes, such as 0.081 cubic meters, and is critical for the modular design approaches required by the current base station customer market. The power amplifier assembly 100 of the present invention dissipates 1,100 watts at room temperature, but its dissipation capability degrades to approximately 750 watts at an ambient temperature of 60 degrees Celsius. In contrast, the dissipation capability of the power amplifier assembly 100 improves at ambient temperatures below room temperature.

Figure 2:
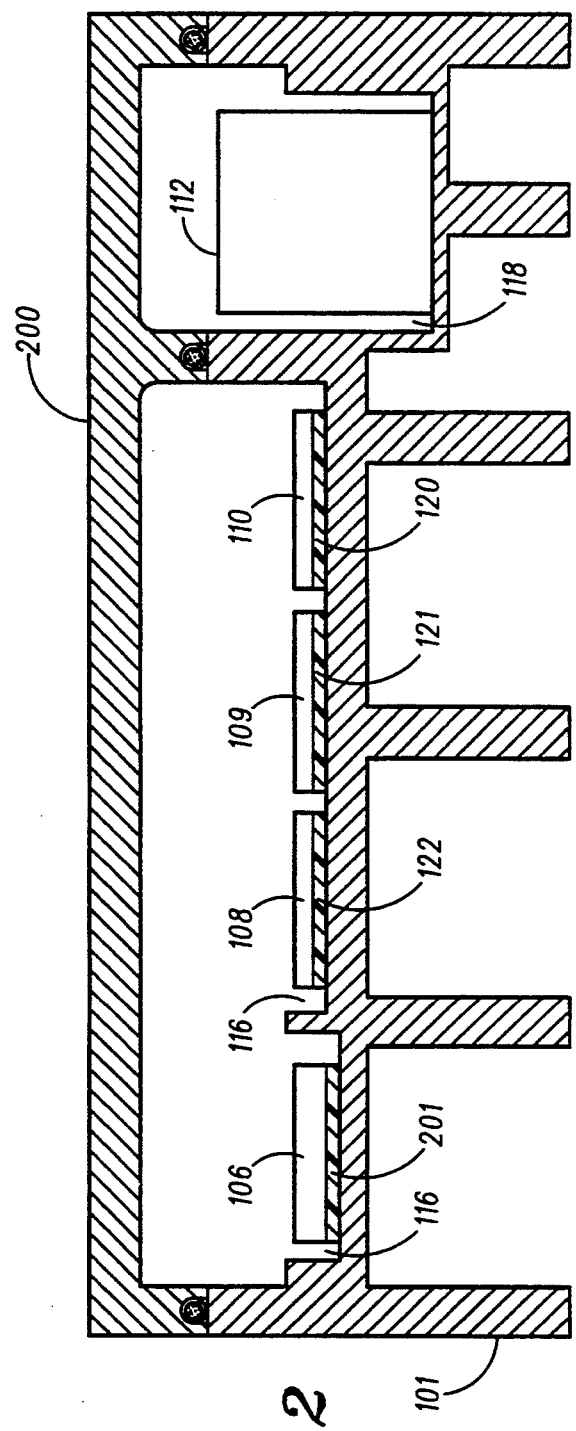
FIG. 2 illustrates a cross-sectional view of a power amplifier assembly in accordance with the present invention.

FIG. 2 illustrates a cross-sectional view of the power amplifier assembly 100 along the 2—2 line of FIG. 1. In this view, the power amplifier assembly 100 includes a cover 200, the heat sink base 101, the recessed areas 116 and 118, the splitter module 106, the second, third, and fourth power elements 108–110, and the isolator module 112. The splitter module 106 and the three power elements 108–110 are thermally coupled to the heat sink base 101 via their respective thermal coupling devices 201, 120–122. The depth of each of the recessed areas 115–118 is chosen to accommodate its respective module such that, when the power amplifier circuit is mounted to the heat sink base 101, the interconnect areas of the circuit elements and the four power elements 104, 108–110 form a substantially planar assembly.

The cover 200 generally comprises aluminum and may include gasketing and extrusions to provide electromagnetic shielding. In the preferred embodiment, the cover 200 forms a metallic enclosure around the lowpass filter and directional coupler module 113 when it is attached, via screws, to the heat sink base 101. This metallic enclosure electromagnetically shields the lowpass filter and directional coupler module 113 from the other circuit and Dower elements in the power amplifier assembly 100. The gasketing contained in the cover 200 is comprised of a silver-filled silicone elastomer applied over a non-conductive extruded silicone core. The non-conductive core material is preferably hollow to permit sufficient shielding performance under low closure forces. The gasketing is placed along the perimeter of the cover 200 and along an extrusion that connects the cover 200 to the heat sink base 101 in the proximity of the lowpass filter and directional coupler module 113. The cover gasketing provides a multiple point metallic interconnect between the cover 200 and the heat sink base 101 which minimizes the amount of electromagnetic energy radiated from, or received by, the power amplifier assembly 100.

The heat sink base 101 preferably comprises aluminum, but may be fabricated from any high conductivity metal. The mounting pattern of recessed areas 116 and 118 may be cast, or machined, into the heat sink base 101. As mentioned above, the recessed areas 116 and 118 vary in depth to accommodate their respective modules and facilitate a substantially planar power amplifier assembly 100 upon attachment of the modules to the heat sink base 101.

Figure 3:
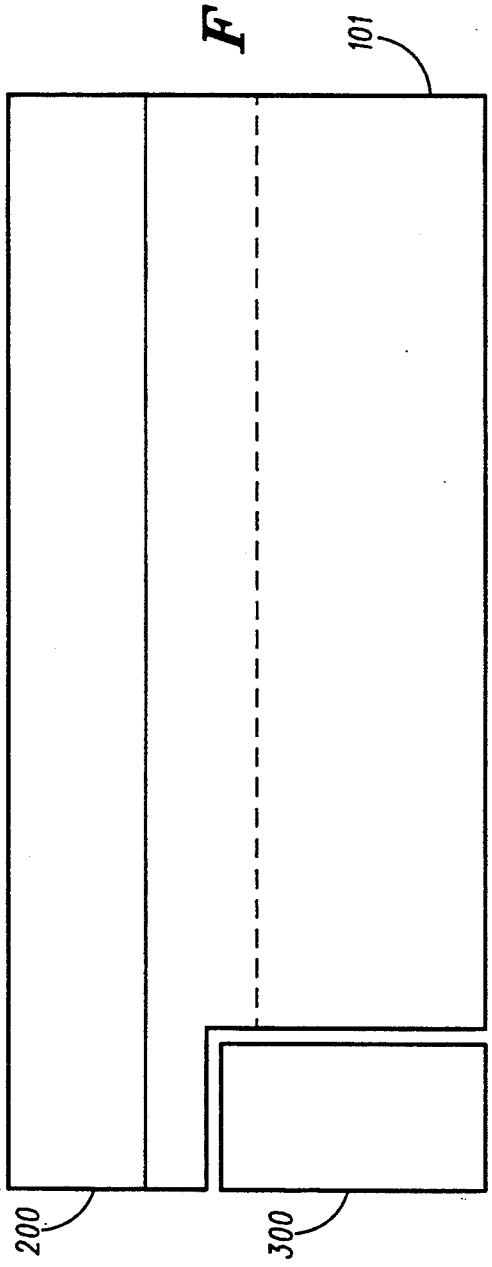
FIG. 3 illustrates a side view of a power amplifier assembly in accordance with the present invention.

FIG. 3 illustrates a side view of the power amplifier assembly 100 that includes the heat sink base 101, the cover 200, and a forced air cooling device 300. As shown, the forced air cooling device 300 is typically an AC or DC fan and is preferably located within the overall volume of the power amplifier assembly 100. As is known, the forced air cooling devices 300 cool the heat sink base 101 by continuously forcing air across the metallic fins. In the preferred embodiment, five fans, each with a maximum flow rate of 42 cubic feet per minute (CFM), are equally spaced across the front of the power amplifier assembly 100. With an excess of 180 CFM supplied by the fans, a temperature gradient is maintained across the fins which allows them to continually conduct heat away from the heat sink base 101.

The present invention provides a power amplifier assembly that dissipates a maximum of one thousand one hundred watts in an overall volume of 0.02 cubic meters. With this invention, a substantially reduced volume, compared to prior art implementations, provides the maximum power dissipation at room temperature. The decreased volume of the present invention provides compatibility with current modular design approaches and facilitates a relatively lightweight power amplifier assembly. The preferred embodiment of the present invention weighs less than 30 pounds. Further, the present invention provides a power amplifier assembly with substantially planar interconnect surfaces without introducing additional parts, such as spacers, to provide the planarity.

We claim:

1. A power amplifier assembly that dissipates a maximum of one thousand one hundred watts, the power amplifier assembly comprises:
   a power amplifier circuit that includes at least one power element and a plurality of circuit elements;
   at least one thermal coupling device that is thermally coupled to the at least one power element; and
   a chassis that includes a heat sink base, wherein the heat sink base includes a mounting pattern for the plurality of circuit elements and the at least one thermal coupling device, wherein the chassis has an overall volume of 0.02 cubic meters, and wherein the heat sink base has a power dissipation of 1,100 watts/0.016 cubic meters.

2. The power amplifier assembly of claim 1 further comprises at least one forced air cooling device, wherein the at least one forced air cooling device forces air across the heat sink base.

3. In the power amplifier assembly of claim 1, the mounting pattern comprises a plurality of recessed areas cast in the heat sink base.

4. In the power amplifier assembly of claim 1, the at least one power element comprises at least one amplifier circuit deposited on a ceramic substrate.

5. In the power amplifier assembly of claim 4, the at least one thermal coupling device comprises a carbon composition material.

6. In the power amplifier assembly of claim 5, the carbon composition material comprises graphite.

7. A power amplifier assembly that dissipates a maximum of one thousand one hundred watts, the power amplifier assembly comprises:
   a power amplifier circuit that includes a direct current (DC) distribution module, a pre-amplifier module, a splitter module, at least one power element, a combiner module, an isolator module, and a low pass filter and directional coupler module;
   a plurality of thermal coupling devices, wherein each of the plurality of thermal coupling devices is thermally coupled to one of either the at least one power element, the splitter module, the combiner module, or the low pass filter and directional coupler module; and
   a chassis that includes a heat sink base, wherein the heat sink base includes a mounting pattern for the DC distribution module, the preamplifier module, the isolator module, and the plurality of thermal coupling devices, wherein the chassis has an overall volume of 0.02 cubic meters, wherein the heat sink base has a power dissipation of 1,100 watts/0.016 cubic meters, and wherein, when the power amplifier circuit is mounted to the heat sink base, the DC distribution module, the pre-amplifier module, the splitter module, the at least one power element, the combiner module, the isolator module, and the low pass filter and directional coupler module form a substantially planar assembly.

8. The power amplifier assembly of claim 7 further comprises at least one forced air cooling device, wherein the at least one forced air cooling device forces air across the heat sink base.

9. In the power amplifier assembly of claim 7, the mounting pattern comprises a plurality of recessed areas cast in the heat sink base.

10. In the power amplifier assembly of claim 7, the at least one power element comprises at least one amplifier circuit deposited on a ceramic substrate.

11. In the power amplifier assembly of claim 10, each of the plurality of thermal coupling devices comprises a carbon composition material.

12. In the power amplifier assembly of claim 11, the carbon composition material comprises graphite.

* * * * *